United States Patent [19]

Yuen

[11] Patent Number: 4,760,540
[45] Date of Patent: Jul. 26, 1988

[54] ADAPTIVE INTERFERENCE CANCELLING SYSTEM AND METHOD

[75] Inventor: Stanley M. Yuen, Jenkintown, Pa.

[73] Assignee: RCA Corporation, Princeton, N.J.

[21] Appl. No.: 676,103

[22] Filed: Nov. 29, 1984

[51] Int. Cl.$^4$ .............................................. G06F 7/38
[52] U.S. Cl. ..................................... 364/724; 364/728
[58] Field of Search ............... 364/724, 758, 736, 728; 358/36, 167; 375/14

[56] References Cited

U.S. PATENT DOCUMENTS

| | | | |
|---|---|---|---|
| 4,121,295 | 10/1978 | Witt | 364/724 |
| 4,344,150 | 8/1982 | McLaughlin | 364/724 |
| 4,392,232 | 7/1983 | Andren et al. | 364/728 |
| 4,454,590 | 6/1984 | Belt et al. | 364/724 |
| 4,493,048 | 1/1985 | Kung et al. | 364/724 X |
| 4,546,445 | 10/1985 | Haugen | 364/728 |
| 4,611,305 | 9/1986 | Iwase | 364/736 |
| 4,649,505 | 3/1987 | Zinser, Jr. et al. | 358/36 |

OTHER PUBLICATIONS

"A Digital Open-Loop Adaptive Processor" by F. F. Kretschmer, Jr. et al., *IEEE Transactions on Aerospace and Electronic Systems*, vol. AES14, No. 1, Jan. 1978, pp. 165–171.

"Why Systolic Architectures?" by H. T. Kung, *Computer (IEEE)*, vol. 15, No. 1, Jan. 1982, pp. 37–46.

Primary Examiner—Gary V. Harkcom
Assistant Examiner—Long Thanh Nguyen
Attorney, Agent, or Firm—Clement A. Berard, Jr.; Raymond E. Smiley

[57] ABSTRACT

An adaptive interference cancelling signal processing system includes N+1 processors for cancelling N interfering auxiliary signals from a primary signal. During a prelook or inactive period of the primary signal when a component of interest is not present in the primary signal, the N+1 processors are configured to produce the N(N+1)/2 correlation coefficients $L_{ij}$ which enable weights for the auxiliary signals to be determined. The same N+1 processors may be reconfigured to convert these $L_{ij}$ values to the N weights without requiring matrix inversion. The N+1 processors may be reconfigured to multiply the auxiliary signals by the N weights during an active period of the primary signal when the component of interest is present in the primary signal. These weighted auxiliary signals are combined with the primary signal to provide a modified primary signal from which correlated interference in the auxiliary signals has been cancelled.

9 Claims, 6 Drawing Sheets

ADAPTIVE INTERFERENCE CANCELLING SYSTEM AND METHOD

BACKGROUND OF THE INVENTION

The present invention relates to adaptive interference cancelling and more particularly to adaptive interference cancelling through use of a pre-look cycle to determine the interference present during an inactive period of a primary signal during which a component of interest is not present and cancelling that interference during a subsequent active period of the primary signal during which the component of interest is present in the primary signal.

Removal of correlated interference signals by adaptive techniques can improve the operation of a number of different types of electronic systems such as radio frequency (RF) antennas, medical electronics, pattern recognition systems and so forth. The correlated interference signals may be noise or a combination of noise and other signals which are not desired. In these techniques, there is a source of a primary signal which has active and inactive periods and which includes a component of interest which is only present during the active periods. The signal provided by this source of the primary signal is contaminated by a number (N) of auxiliary signals. There are also sources from which those N auxiliary signals may be obtained.

Where the component of interest is only intermittently present in the primary signal, the signals from all N+1 sources (N auxiliary signals and the primary signal) during a pre-look interval, during which the component of interest is absent, are processed to determine the N weights each of which should multiply a different one of the N auxiliary signals during an active period when the component of interest is present in the primary signal. During the presence of the component of interest, each of the auxiliary signals is multiplied by its corresponding weight and these weighted signals are combined with the received primary signal. It is conventional to assign the primary signal a weight of one. The signs of the weights and their magnitudes are selected such that the resulting combination is the desired signal substantially free of correlated interference. Where there are N auxiliary signals the process of determining these N weights involves determining $N(N+1)/2$ correlation coefficients $L_{ij}$. These correlation coefficients $L_{ij}$ are the elements of an $N+1$ by $N+1$ matrix which occupy the portion of the matrix below the diagonal of that matrix. The diagonal of this matrix is all ones and the elements above the diagonal are all zeroes. Prior art digital implementations of this type of system require $N(N+3)/2$ processors to determine the $N(N+1)/2$ correlation coefficients $L_{ij}$. Thus, if there are twelve auxiliary signals, ninety processors are required. Twelve auxiliary signals is a realistic situation with respect to the cancellation of sidelobe signals in an adaptive RF antenna. In order to determine the weights, the $N+1$ by $N+1$ matrix of which the correlation coefficients are elements must be inverted. This matrix inversion process is computationally demanding and constitutes a bottleneck which severely limits the speed with which the weights can be determined. This matrix inversion process requires separate hardware from the $N(N+3)/2$ processors which determine the correlation coefficients.

Once the weights have been determined, then during an active period where the component of interest is present in the primary signal, each of the received N+1 signals is multiplied by its corresponding weight which was determined during the pre-look interval and those products are summed. The resulting sum is the desired signal as received, except for the cancellation of substantially all of the correlated interference present in the auxiliary signals.

Such interference cancellation can be vital in a number of different systems. However, at present the quantity of hardware and the time required to obtain this cancellation makes the use of such cancellation techniques in real time prohibitive in many of those systems. Thus, in order to make real-time systems of this type feasible there is a need for an adaptive interference cancellation system which requires fewer processors and requires less time to derive the weights than these prior art systems do.

SUMMARY OF THE INVENTION

The present invention provides an adaptive correlated interference cancellation system which is suitable for use in real-time. This system only needs N+1 processing units to cancel the correlated interference in N auxiliary signals from a primary signal. First, these processing units are used during a pre-look period during which the component of interest is not present in the primary signal to obtain the correlation coefficients $L_{ij}$, then during a conversion period these processing units are used to convert these correlation coefficients to the N weights for the auxiliary signals. During reception of the primary signal including the component of interest these processing units are used to multiply the received auxiliary signals by their weights. These N+1 processing units are interconnected for recursive processing of the received signals both during the pre-look portion of the process and during the conversion portion of the process. During an initial portion of the pre-look, correlation-coefficient-determination phase of the process, each of the processors receives a corresponding one of the input signals. During the subsequent portion of the correlation coefficient determination phase, external input signals are not received and the processor input signals are supplied from within the signal processing system. For the conversion portion of the process the processors may be reconfigured to convert the correlation coefficients to the weights by a recursive process rather than by direct inversion of the N+1 by N+1 matrix. For the portion of the process during which the component of interest is received, each of the processors may be configured to multiply its received input signal by the corresponding weight. The resulting products are combined in an (N+1)-input adder whose output is a series of digital values which comprise the desired signal from which the correlated interference has been cancelled.

DETAILED DESCRIPTION

Figure 1:
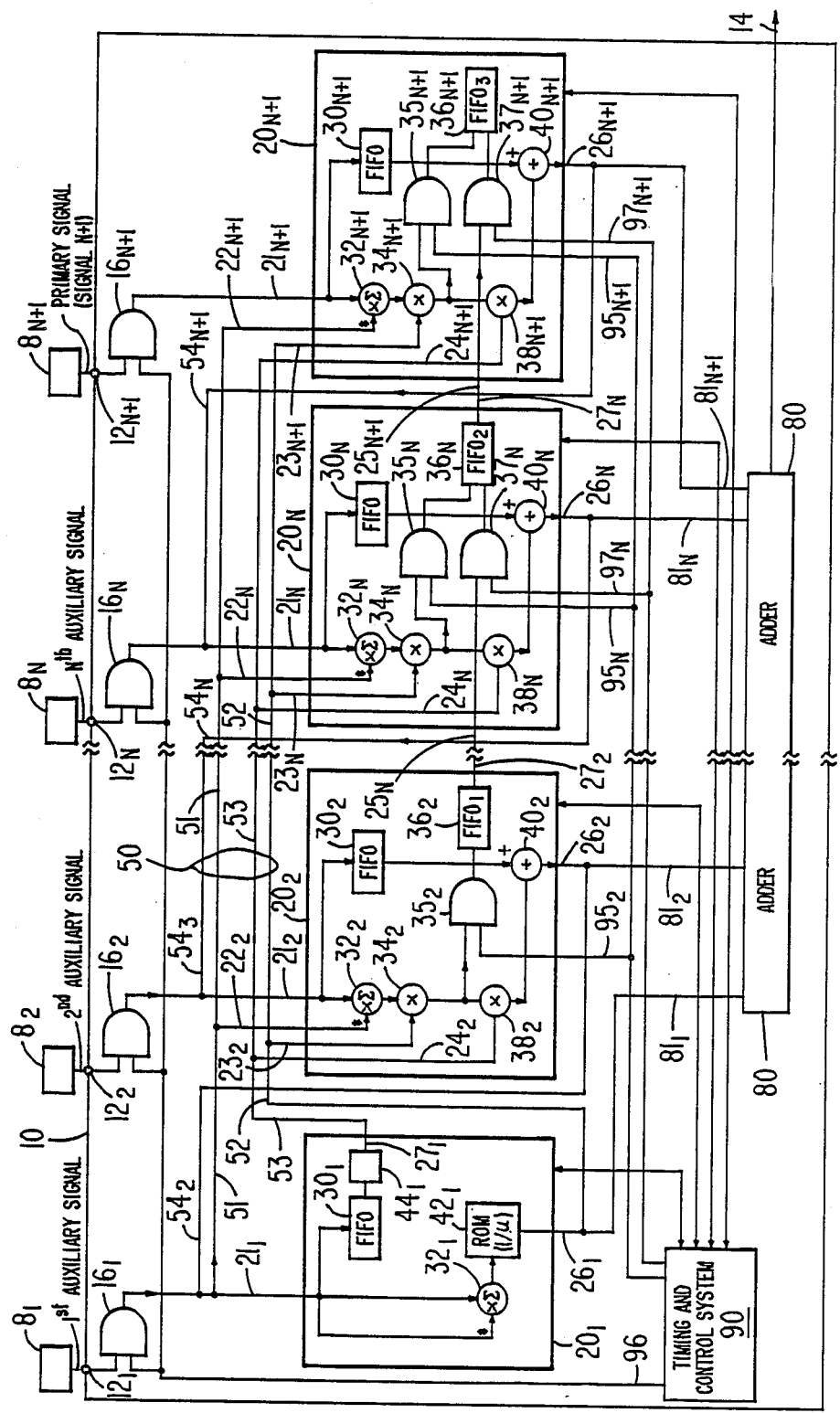
FIG. 1 illustrates in block diagram form a signal processing system in accordance with the present invention configured to determine correlation coefficients.

This description begins with a brief description of the prior art system for cancelling interfering signals followed by a brief description of how the present invention improves on that prior art. This is to aid the reader in understanding the detailed description of the present invention.

In the prior art systems for cancelling N interfering auxiliary signals from a primary signal through use of pre-look processing, the $N(N+3)/2$ processors required are arranged in N rows and $N+1$ columns. The first row contains $N+1$ processors. The second row contains N processors, the third row contains $N-1$ processors and so forth down to the $(N-1)^{th}$ row which contains three processors and the $N^{th}$ (final) row which contains two processors. The left-most (first) column contains one processor, the second column from the left contains two processors, and so on through the $(N-1)^{th}$ column from the left which contains $N-1$ processors and the $N^{th}$ and $N+1^{th}$ columns from the left each of which contains N processors. The processors of the first row receive their inputs from the $N+1$ signal sources (the N auxiliary signals plus the primary signal). This first row of processors operates during a first stage of the process of determining the correlation among the auxiliary and primary signals. During this stage, N $L_{ij}$ values $L_{2,1}$; $L_{3,1} \ldots L_{N,1}$, and $L_{N+1,1}$ are derived. These correlation coefficient values are the correlation between the first auxiliary signal and each of the other signals 2 to $N+1$, respectively, where the subscript $N+1$ refers to the primary signal.

The indices i and j in $L_{ij}$ are the column and row in this prior art processor array in which the processor is located which generates the coefficient $L_{ij}$. These $L_{i,1}$ values are stored and modified signals derived from the $2^{nd}$ through $(N+1)^{th}$ signals are passed as inputs to the N processors of the second row. Each of these modified signals comprises its original signal from which any components correlated with the first auxiliary signal have been cancelled. No modified version of the first auxiliary signal is passed to this second row. The processors of this second row operate during a second stage of the correlation determination process. During this stage $(N-1)$ $L_{ij}$ values $L_{3,2}$; $L_{4,2}$; ... $L_{N,2}$ and $L_{N+1,2}$ are derived. These $L_{i,2}$ values are the correlation between the modified second auxiliary signal (i.e. from which the components correlated with the first auxiliary signal have been cancelled) and the other modified signals. In the next row, the inputs are further modified signals derived from the third auxiliary signal through the primary $(N+1)^{th}$ signal. These further modified signals have had their components cancelled which are correlated with the modified second signal. This process proceeds sequentially through the successive rows with each row determining a further set of $L_{ij}$ values and cancelling from each remaining modified signal those components which correlate with the lowest number modified "auxiliary" signal still present. In the final row the correlation $L_{N+1,N}$ of the then current modified $N^{th}$ auxiliary signal with the then current modified primary signal is determined. Those components of that modified primary signal which correlate with that modified $N^{th}$ auxiliary signal are cancelled and a final modified primary signal is provided as an output. This final modified primary signal is decorrelated from all of the auxiliary signals.

Thus, each row of $L_{ij}$ values in the prior art matrix represents the correlation between two signals, most of which are themselves modified by the cancellation of other correlated signals.

Once all of these $L_{ij}$ values have been determined, the correlation determination portion of the process is complete.

The correlation coefficients $L_{ij}$ are then converted to N weights which can be multiplied by the N auxiliary signals during a period when the component of interest is present in the primary signal so that those products can be combined with the primary signal to provide a modified primary signal which is decorrelated from all of the auxiliary signals.

A first step in this conversion process involves inverting the correlation matrix of $L_{ij}$ values to produce a matrix of corresponding weights. The required weights are the negative of the elements in this weight matrix.

The present invention improves on this prior art system and method by only using $N+1$ processors to determine the $L_{ij}$ values. This is done by connecting the $N+1$ processors to perform all N stages of the correlation determination process in a recursive manner by providing the output signals from one stage of the process as new input signals to the same set of processors rather than to an additional row of processors. This produces the same $L_{ij}$ values as the prior art technique, but requires much less hardware.

The present invention determines the weights from the $L_{ij}$ values without requiring matrix inversion and can do so using the same $N+1$ processors as were used to derive the $L_{ij}$ values. Once again, these processors are connected and configured to perform this process in a recursive manner.

An adaptive, correlated-interference-cancelling, signal processing system 10 in accordance with the present invention is illustrated in block diagram form in FIG. 1. The system 10 is configured to produce the correlation coefficients ($L_{ij}$) among N auxiliary signals and a primary signal during a prelook period in which a component of interest is not present in the primary signal.

The signal processing system 10 has $N+1$ input terminals $12_1$, $12_2$, ... $12_N$ and $12_{N+1}$ and an output terminal 14. Each of the terminals $12_1$, ... $12_N$ is connected to a different signal source $8_1$–$8_N$ to receive a corresponding one of the auxiliary signals. Input terminal $12_{N+1}$ is connected to source $8_{N+1}$ to receive the primary signal. Thus, the primary signal may be referred to as the $(N+1)^{th}$ signal. Internally, the signal processing system 10 is comprised of $N+1$ processors $20_1$, $20_2$, ... $20_{N+1}$ and $20_{N+1}$, a signal bus system 50 interconnecting the processors, an adder 80 and a timing and control system 90.

In this specification, similar elements such as the input terminals 12 are identified by a common numerical value for their reference numeral and are distinguished from each other by different subscripts on that common reference numeral value. Different elements whose reference numerals have a common subscript are associated with each other as with the input terminal $12_1$, the signal source $8_1$ and the processor $20_1$.

All of the data buses, terminals and processors in this system preferably operate in a multi-bit parallel manner in order to minimize data transmission times. The signal provided by each of the sources $8_1$–$8_{N+1}$ is a complex digital signal in the form of separate in-phase (I) and quadrature (Q) component values which together uniquely specify that signal's complex value. The sources 8 may comprise analog-to-digital converters which convert analog signals to digital form for interference cancellation.

All of the processors 20 may be identical, if desired. However, the processors $20_1$, $20_2$ and $20_{N+1}$ do not require all of the components present in processors $20_3$–$20_N$ and processor $20_1$ contains two components not needed by the other processors. In describing the processors, processor $20_N$ will be described in detail followed by discussion of the differences between that processor and the processors $20_1$, $20_2$ and $20_{N+}$.

The processor $20_N$ has five input terminals, a first input terminal $21_N$, a second input terminal $22_N$, a third input terminal $23_N$, a fourth input terminal $24_N$ and a fifth input terminal $25_N$. Processor $20_N$ also has two output terminals $26_N$ and $27_N$. Within processor $20_N$ there is a first-in, first-out (FIFO) memory $30_N$. This memory is coupled to receive and store digital values received at the processor's first input terminal $21_N$ A two-input summing multiplier $32_N$ has one input connected to receive digital values from the first input terminal $21_N$ and has its other input coupled to receive digital values from the second input terminal $22_N$. The summing multiplier $32_N$ multiplies the complex conjugate of the value received at the input $22_N$ times the value received at the input $21_N$ and accumulates a sum of these products for a number of cycles which is determined by the timing and control system 90. This number of cycles is preferably at least 2N. That complex conjugate is obtained by changing the sign on the Q component value. Thus, the complex conjugate is easily obtained.

A multiplier $34_N$ has a first input terminal connected to receive as its input the sum of the products which is provided by summing multiplier $32_N$. The multiplier $34_N$ has its other input coupled to receive digital values from the third input terminal $23_N$. The output of the multiplier $34_N$ is a correlation coefficient $L_{ij}$. In the notation in this specification, the subscripts i and j on the correlation coefficients $L_{ij}$ are the column index and the row index, respectively, in the prior art matrix which must be inverted to arrive at the weights. It will be noted, that this column index i, then row index j order is the reverse of normal matrix notation. The present notation is utilized because as has been discussed, the traditional nomenclature for $L_{ij}$ indices associates them with the position in the prior art triangular array of processors of the processor which produces the value $L_{ij}$. It will be noted that i>j for all of these $L_{ij}$'s.

The output of the multiplier $34_N$ is connected through an AND gate $35_N$ to the input of a second first-in, first-out (FIFO) memory $36_N$. The second input to AND gate $35_N$ is a control line $95_N$ from timing and control system 90. In this configuration, the output of the FIFO memory $36_N$ is connected to the second output terminal $27_N$ of the processor $20_N$. There is also a connection from the fifth input terminal $25_N$ through another AND gate $37_N$ to the input of FIFO memory $36_N$. The second input to the AND gate $37_N$ is a control line $97_N$ from timing and control system 90. Control lines $95_N$ and $97_N$ carry control signals for isolating the input to FIFO $36_N$ from the output of multiplier $34_N$ and input terminal $25_N$, respectively, except at times when it is desired to provide a new value to the FIFO memory from the corresponding source. The output of the multiplier $34_N$ is also provided as the first input of a multiplier $38_N$. The second input of the multiplier $38_N$ is coupled to the fourth input terminal $24_N$.

In operation, the input value received from multiplier $34_N$ is retained in multiplier $38_N$ and multiplied times each of a sequence of values received at its other input. The product of each of these multiplications is provided in sequence at the output terminal of the multiplier $38_N$. The output terminal of the multiplier $38_N$ is connected to a negative input of an adder $40_N$. The adder $40_N$ has its positive input coupled to the output of the first FIFO memory $30_N$ to receive the stored values which were originally received at the first input $21_N$. The first of those input values is provided to the positive input of adder $40_N$ by FIFO $30_N$ at the same time as the first product from multiplier $38_N$ is provided to the negative input of the adder $40_N$. The difference between these two values is provided as the output from adder $40_N$ and is connected directly to the first output terminal $26_N$ of the processor $20_N$. This addition process continues through all of the values originally received from the signal source $8_N$.

Each of the processors $20_3$–$20_{N-1}$ is identical to the processor $20_N$. The processor $20_{N+1}$ is identical to the processor $20_N$ except for the absence of a second output terminal $27_N$. The processor $20_2$ has no fifth input terminal and only one connection to the input of FIFO memory $36_2$ and no AND gate 37. The processor $20_1$ only has one input terminal $21_1$ and has a FIFO memory $30_1$ and a summing multiplier $32_1$ similar to those in the processor $20_3$. No multiplier 34 or 38 or adder 40 or second FIFO memory 36 or AND gate 35 or 37 is needed in the processor $20_1$. Two additional elements, a read only memory (ROM) $42_1$ and a data latch $44_1$ are present in the processor $20_1$ which are not present in the remaining processors $20_2$–$20_{n+1}$. The ROM $42_1$ has its input coupled to receive the final product sum from the multiplier $32_1$ and has its output terminal connected to the first output terminal $26_1$ of the processor $20_1$. The ROM $42_1$ provides as its output the reciprocal of the value it receives as its input address from summing multiplier $32_1$. The latch $44_1$ is connected to receive the output from FIFO memory $30_1$ in order to be able to stretch the time period during which the data provided by FIFO $30_1$ comprises a valid input to other processors. The output of latch $44_1$ is connected to output terminal $27_1$ of processor $20_1$.

In this $L_{ij}$ determination configuration of system 10, each of the input terminals $12_1$–$12_{N+1}$ system 10 is connected to one input of a two-input AND gate $16_1$–$16_{N+1}$, respectively. The other input of each of these AND gates is connected to a control line 96 from timing and control system 90. The output terminal of each AND gate $16_1$–$16_{N+1}$ is connected to the first input terminal $21_1$–$21_{N+1}$, of the corresponding processor $20_1$–$20_{N+1}$. The input terminal $21_1$ of processor $20_1$ is also connected by a bus 51 to the second input terminal $22_2$–$22_{N+1}$, respectively of each of the other processors $20_2$–$20_{N+1}$. The first output terminal $26_1$ of processor $20_1$ is connected by a second bus 52 to the third input terminal $23_2$–$20_{N+1}$ of each of the other processors $20_2$–$20_{N+1}$, respectively. The second output terminal $27_1$ of processor $20_1$ is coupled by a third bus 53 to the fourth input terminal $24_2$–$24_{N+1}$ of each of the other processors $20_3$–$20_{N+1}$, respectively. A set of buses $54_2$–$54_{N+1}$ each connect the first output terminal $26_2$–$26_{N+1}$ of their corresponding processors $20_2$–$20_{N+1}$ to the first input terminal $21_1$–$21_N$ of the next lower order processor $20_1$–$20_N$, respectively.

The adder 80 has N+1 terminals $81_1$–$81_{N+1}$ which are respectively connected to the first output terminals $26_1$–$26_{N+1}$ of the processors $20_1$–$20_{N+1}$, but adder 80 is not used during the process of determining the correlation coefficients.

The process of determining the correlation coefficients $L_{ij}$ operates on a series of synchronized digital values from the signal sources $8_1$–$8_{N+1}$. The number (K) of values received from each of the sources during correlation coefficient determination is a matter of design selection. However, in order to obtain good correlation among the signals, it is preferred that K≧2N. A value of 2N is preferred because a value of K>2N does not appreciably increase the interference cancellation provided by the system but does increase the processing time required between successive periods of receiving the desired signal. For clarity in the description of the correlation coefficient determination process, that process is partitioned into N stages each of which determines the $L_{ij}$'s for a different value of j, starting with j=1 and working up to j=N. Thus, the first stage determines the $L_{i,1}$'s, the second stage determines the $L_{i,2}$'s and so forth. There are N different $L_{i,1}$'s (N−1) different $L_{i,2}$'s and one $L_{N+1'N}$. Each of the N stages of the correlation coefficient determination process involves K data acquisition cycles. During the first stage, data values are acquired by each processor $20_1$–$20_{N+1}$ from the corresponding signal source $8_1$–$8_{N+1}$ through the AND gates $16_1$–$16_{N+1}$.

Figure 2A:
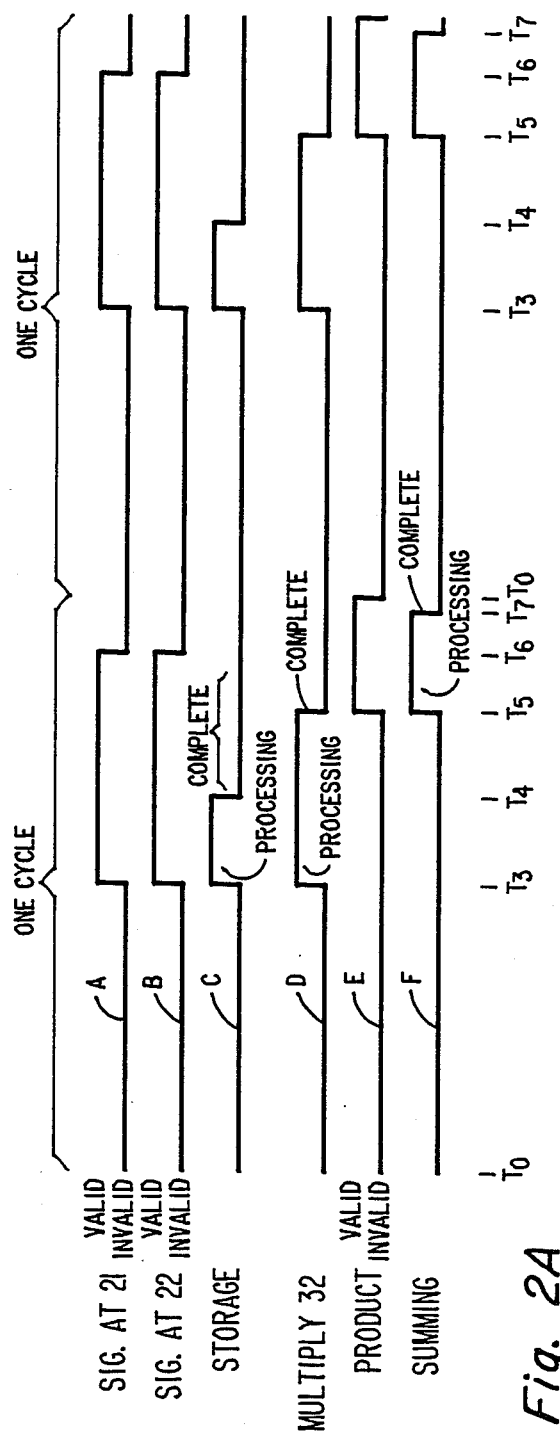
FIGS. 2A, 2B and 2C are timing diagrams showing the operational sequence of the system as configured in FIG. 1.

Prior to the beginning of the coefficient determination process, the system is initialized by resetting all of the FIFO memories 30 and 36 to an empty condition. Reference is now made to FIG. 2A which illustrates the timing of the first cycle of the first stage of the correlation coefficient determination process. During this cycle, one digital value is received at each of the input terminals $12_1$–$12_{N+1}$ of system 10 from the signal sources $8_1$–$8_{N+1}$, respectively. During a first portion ($T_0$–$T_3$) of this cycle nothing takes place. During a subsequent portion ($T_3$–$T_6$) these input values at the first input terminals 21 are valid as shown by curve A in FIG. 2A. The inputs at the second input terminals 22 of each of the processors $20_2$–$20_{N+1}$ are also valid during this same period as shown in curve B. During the period ($T_3$–$T_4$) the value at the first input terminal 21 of each of the processors is transferred to storage in its FIFO memory 30 as shown in curve C of FIG. 2A.

Figure 2B:
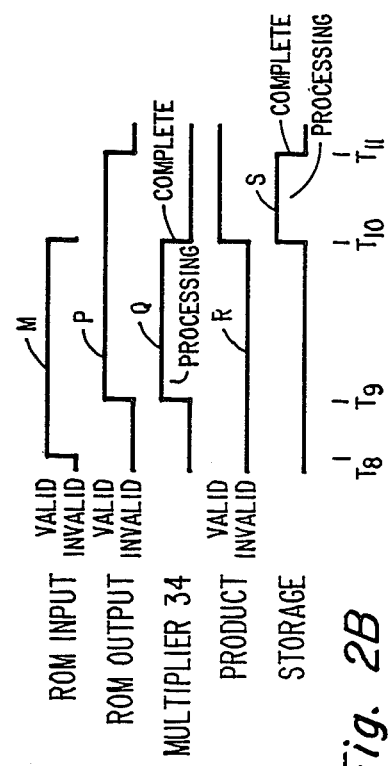

During the period ($T_3$–$T_5$) the summing multiplier 32 in each processor multiplies the value at the input terminal 21 times the complex conjugate of the value at input terminal 22 as shown in curve D. At time $T_5$, the product of the multiplication operation becomes valid as shown by curve E and between the time $T_5$ and the time $T_7$ the summing part of multiplier 32 adds that product to its stored sum of products as shown in curve F. During this initial cycle the previously stored sum of products is zero because of the system initialization prior to the beginning of the data acquisition cycle. Once the new value of the product sum is valid, all required operations in this cycle have been performed. This completes this first cycle and the process proceeds to the second cycle in which the second data value at the output of each of the AND gates $16_1$–$16_{N+1}$ becomes valid at the time $T_3$ of that cycle as shown in curves A and B. This process repeats in this manner through the receipt of the last set ($K^{th}$ set) of these digital data values from sources $8_1$–$8_{N+1}$. Upon completion of this $K^{th}$ cycle no more data values from the sources $8_1$–$8_{N+1}$ are collected. The transmission of further data values from the sources 8 to inputs 21 is prevented by timing and control system 90 applying a false (low level) signal via control line 96 to the control input of each of the AND Gates 16. During a transition cycle which completes the first stage of the coefficient determination process, the input values at the top inputs of the multipliers $34_2$–$34_{N+1}$ become valid at time $T_8$ as shown in curve M of FIG. 2B. The sum of the products for the first processor $20_1$ is provided as the input signal to the ROM $42_1$. That ROM provides the reciprocal of that value as its output. At time $T_9$ the resulting input value at the third inputs 23 of each of the processors 20 becomes valid as shown in curve P. From time $T_9$ to time $T_{10}$ as shown in curve Q, the multipliers 34 multiply their two inputs to produce their $L_{ij}$ values. In this first stage these $L_{ij}$ values are the values $L_{2,1}, \ldots L_{N+1'1}$. There are N different ones of these $L_{i,1}$ values. Once these $L_{ij}$ values become valid at $T_{10}$ (curve R) the $L_{ij}$ value in each processor is stored in its second FIFO memory 36 by applying a true signal to each of the control lines 95 to turn each of the AND gates 35 on. This value is also provided to the multiplier 38 during the period $T_{10}$–$T_1$.

The $L_{i,1}$ values determined by this first stage of the process are the correlations of the signals i with the first auxiliary signal. During this first stage of the process, the values provided at the processor input terminals 8 were received from the signal sources 8, while the value provided at the input terminals 23 was generated within processor $20_1$. Within each multiplier 38 its $L_{i,1}$ value is stored for use as a constant to multiply times each of a series of inputs to be provided to the other input of the multiplier 38. Once the constant value in the multipliers 38 has become valid, the second stage of the coefficient determination process begins.

Figure 2C:
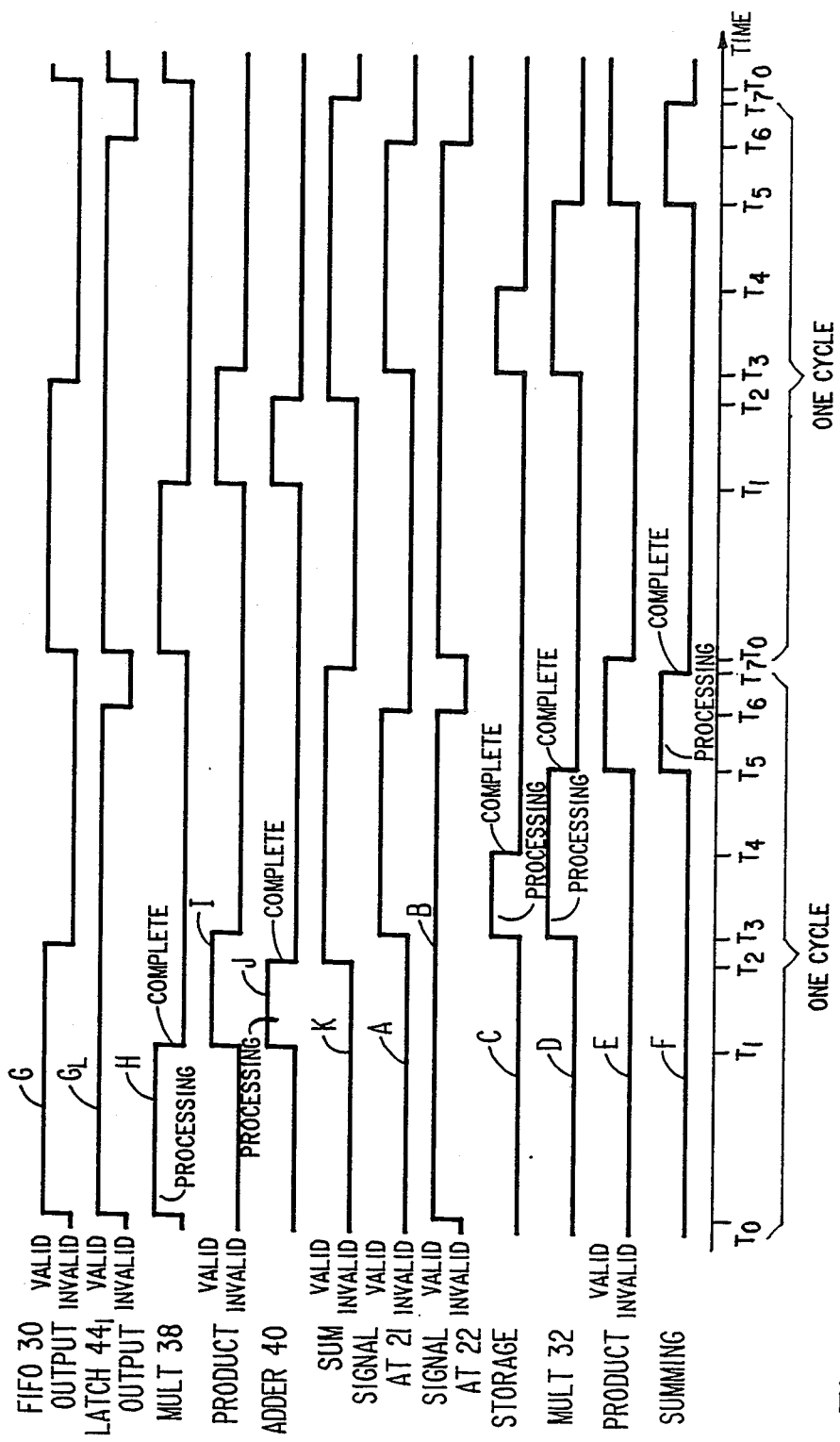

This second stage will generate the (N−1) different $L_{ij}$ values $L_{i,2}$. The second through $N^{th}$ stages of this process differ from the first stage in that the values at the input terminals 21 and 22 are generated internally of system 10 by its processors 20 from the stored data contained therein. The first cycle of this second stage begins with each FIFO memory 30 providing its first-in stored value at its output. These values are valid from time $T_0$ to time $T_3$ of this cycle (curve G of FIG. 2C). The value provided by the FIFO $30_1$ in the first processor $20_1$ is provided to latch $44_1$ and from there to the bus 53 which provides it to the fourth input 24 of each of the other processors. The value from latch $44_1$ is valid from $T_0$ to $T_6$ of this cycle (curve $G_L$ in FIG. 2C). The value from each of the other FIFOs 30 ($30_2$–$30_{N+1}$) is provided to the upper or positive input of its corresponding adder $40_2$–$40_{N+1}$, respectively and is only valid until $T_2$. During the period $T_0$–$T_1$ each multiplier 38 multiplies the value at the fourth input 24 of its processor by its $L_{i,j}$ value, which in this second stage, is an $L_{i,1}$ value (curve H). Once the product of that multiplication becomes valid at time $T_1$ (curve I) each adder $40_2$–$40_{N+1}$ is activated during the period $T_1$–$T_2$ (curve J) to subtract that value from the value at its positive input (from its corresponding FIFO memory $30_2$–$30_{N+1}$, respectively). Once that difference becomes valid at time $T_2$ (curve K) that value is provided at the first output terminal $26_2$-$26_{N+1}$ of that processor and is transmitted by the set of buses $54_2$-$54_{N+1}$ to the first input terminal 21 of the next lower processor. These series of values are the values of the signals i from which the correlated portions of the first auxiliary signal have been removed. These new, partially de-correlated values on being received at the inputs 21 of each processor become the "acquired data" value for that processor and are treated in the same manner as the acquired data values from the sources 8 were during the first stage. This newly acquired value is stored in the FIFO memory 30 of its receiving processor beginning at time $T_3$ whereby the FIFO memories continue to store K values. No new data values are received by the processor $20_{N+1}$ since there is no higher order processor to its right in FIG. 1. As a result, the number of non-zero values stored in the FIFO memory $30_{N+1}$ decreases by one during each cycle of this stage. At the end of the stage it stores only zeros.

The acquired data values (from terminals 26) become valid at time $T_3$ of this cycle and remain valid until time $T_6$. The value from terminal $26_2$ of processor $20_2$ is applied to input $21_1$ of processor $20_1$ and to the second inputs $22_2$-$22_{N+1}$ of the rest of the processors.

For reasons which will become apparent during the description of the process of converting the $L_{ij}$'s to weights, it is desired to store all of the $L_{i,1}$'s derived during the first stage of the coefficient determination process in the FIFO memory $36_{N+1}$ of the processor $20_{N+1}$. Consequently, each of the FIFO memories $36_2$-$36_N$ is cycled at the same rate as the FIFO memories 30 as a means of transmitting these $L_{ij}$ values in sequence to FIFO memory $36_{N+1}$. During this cycling, the AND gates 35 are held off by a false control signal on the control lines 95 and each AND gate 37 is held open until the last $L_{ij}$ value ($L_{2,I}$ in this instance) has passed through to its associated FIFO memory 36. As a result, one additional $L_{i,1}$'s value is stored in FIFO $36_{N+1}$ on each cycle until all of the $L_{i,1}$'s determined during the first stage are stored in FIFO $36_{N+1}$. Since there are only N different $L_{i,1}$ values and there are K=2N cycles in each stage in this embodiment there are more than enough cycles available in this second stage to perform these transfers. Other means of transferring the $L_{ij}$'s to the appropriate processors may be used if desired, however, the present technique is preferred because it meshes easily with the calculation of the $L_{ij}$'s without requiring any extra processing cycles.

As the product sums in the multipliers 28 accumulate during this second cycle, the system is in the process of determining the (N−1) different $L_{i,2}$ coefficients. The values $L_{i,2}$ will end up all stored in FIFO memory $36_N$.

In this manner, the process continues with the outputs from the adders $40_2$-$40_{N+1}$ providing the input data values for the processors $20_1$-$20_N$, respectively. When the K cycles of this second stage of the $L_{ij}$ generation process have been completed, another transition cycle takes place and the process then repeats itself for the third stage. During that third stage or repetition of this process, the processor $20_N$ receives no non-zero input values at its terminal $21_N$ since the first output of the processor $20_{N+1}$ will remain zero because processor $20_{N+1}$ received no inputs during the previous stage. The other change which takes place is that the $L_{ij}$ values which were determined during the second stage are transferred to storage in the FIFO memory $36_N$ during this third Stage. These $L_{ij}$ values are $L_{3,2}, \ldots L_{N+1,2}$.

This process continues sequentially through N stages at which time the FIFO memory $36_2$ has one $L_{i,N}$ value ($L_{N+1,N}$) stored in it, the FIFO memory $36_3$ has two $L_{i,N-1}$ values ($L_{N+1,N-1}$ and $L_{N,N-1}$) stored in it, ... the FIFO memory $36_N$ has all (N−1) of the $L_{i,2}$ values stores in it and the FIFO memory $36_{N+1}$ has all N of the $L_{i,1}$ values stored in it. At that point, all of the $L_{ij}$ values have been determined and the coefficient determination portion of the process is complete. The process is now ready to proceed to converting the $L_{ij}$ values to the weights which are needed for multiplying the received signals during the reception of the desired signal.

Figure 3:
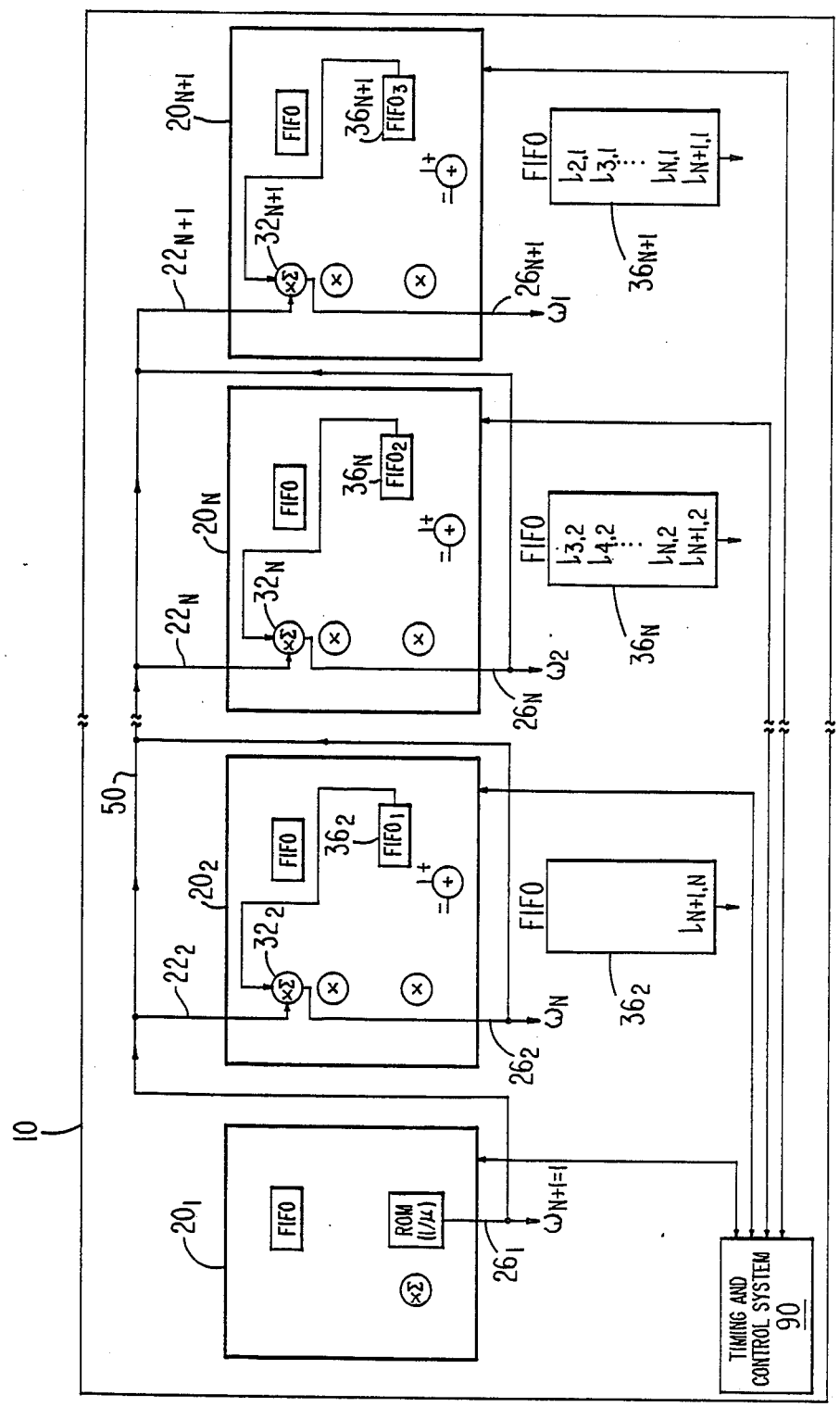
FIG. 3 is an illustration of the processing system of FIG. 1 reconfigured for converting correlation coefficients to signal weights.

FIG. 3 illustrates in block diagram form the processor 10 reconfigured for converting the stored $L_{ij}$ values to the weights $W_1$-$W_N$ (illustrated as $W_1$-$W_n$ in FIG. 3). The weight $W_{N+1}$ for the primary signal is always unity. In this configuration, the first input terminal of each of the summing multipliers $32_2$-$32_{N+1}$ is connected to the output terminal of the FIFO memory $36_2$-$36_{N+1}$ within that processor. The values stored in each FIFO 36 are illustrated in blocks positioned below the associated processors in FIG. 3. The other input terminal of each of these summing multipliers is connected to the second input terminal 22 of that processor. The output of each of these summing multipliers is connected directly to the output terminal 26 of that processor. The output terminal 26 of each of the processors is connected to the second input terminal 22 of each higher numbered processor by the bus system 50. Only one of the processors 20 provides an output at its first output terminal 26 in each cycle of the conversion process. Since the only function of processor $20_1$ in this reconfiguration is to provide the value one as the initial input value to the other processors, the processor $20_1$ in this configuration can be replaced by a source of the value one.

Figure 4:
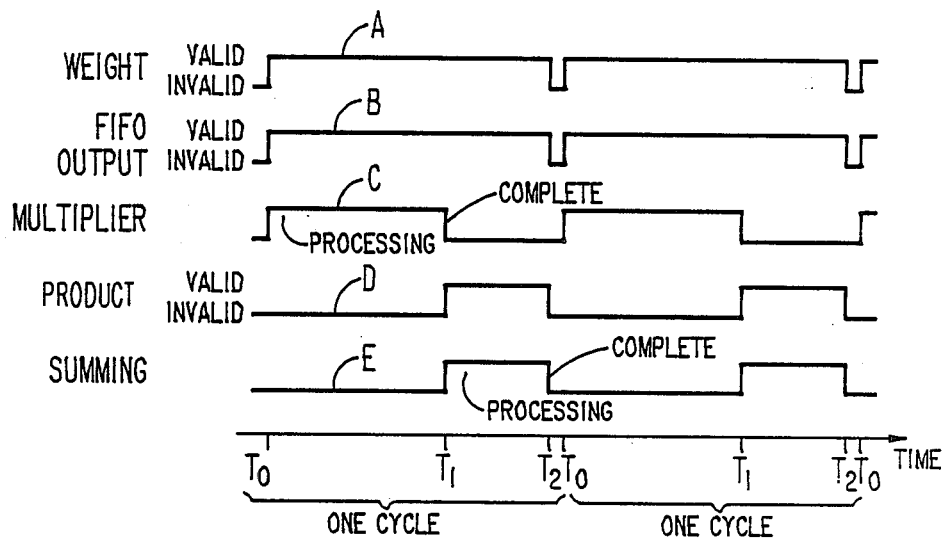
FIG. 4 is a timing diagram illustrating the operation of the system in the configuration of FIG. 3.

To start the conversion process the first processor $20_1$ provides the digital value 1 at its output which is the weight $W_{N+1}$. The first $L_{ij}$ value stored in each FIFO memory 36 is provided at its output and coupled to the first input of the summing multiplier 34 in that processor. Both the weight value and the FIFO output values become valid at $T_0$ of this cycle (curves A and B, respectively in FIG. 4). The weight value $W_{N+1}$ is coupled to the first input terminal of each of the processors $20_2$-$20_{N+1}$. During this first cycle of the weight determination process, the $L_{ij}$ value in the second processor $20_2$ is $L_{N+1,N}$, the value in the third processor is $L_{N+1,N-1}$, down through the value $L_{N+1,2}$ in the processor $20_N$ and the value $L_{N+1,1}$ in the processor $20_{N+1}$. During the time from $T_0$ to $T_1$ (curve C) the multipliers 34 carry out these multiplications and at time $T_1$ the products become valid (curve D). During the period $T_1$-$T_2$ these products are added to the accumulated sum (curve E). During this cycle, the previously stored value is zero. At time $T_2$, the sum becomes valid. This sum remains valid until time $T_1$ of the next cycle. At the end of each cycle m, the product sum in the processor m+1 is provided at the first output of that processor. At the end of this first cycle, this accumulated sum is the single product ($L_{N+1,N}$). Thus, the weight is $L_{N+1,N}$. This weight is t input to all higher number processors $20_3$-$20_{N+1}$ for the next cycle. During that next cycle that weight value is multiplied by the $L_{ij}$ values $L_{N,N-1} \ldots L_{N,1}$ in the various processors and accumulated for the next cycle, the output from the processor $20_3$ is the weight $W_{(N-1)}$ which becomes the input to the remaining processors to the right for the third cycle. At the end of N cycles, the $L_{ij}$'s have been converted to the N weights $W_1$-$W_N$.

Each of the weights $W_i$ may be temporarily stored in the timing and control system 90 during this process. Once all of the weights have been determined, the weight $W_1$ is provided to the processor $20_1$, the weight $W_2$ is provided to the processor $20_2$ ... through the weight $W_{N+1}=1$ being provided to the processor $20_N$ and the weight $W_{N+1}=1$ being provided to the processor $20_{N+1}$.

The system 10 may then be reconfigured once again into a configuration for multiplying the weights times the received signals during the reception of the desired signal.

Figure 6:
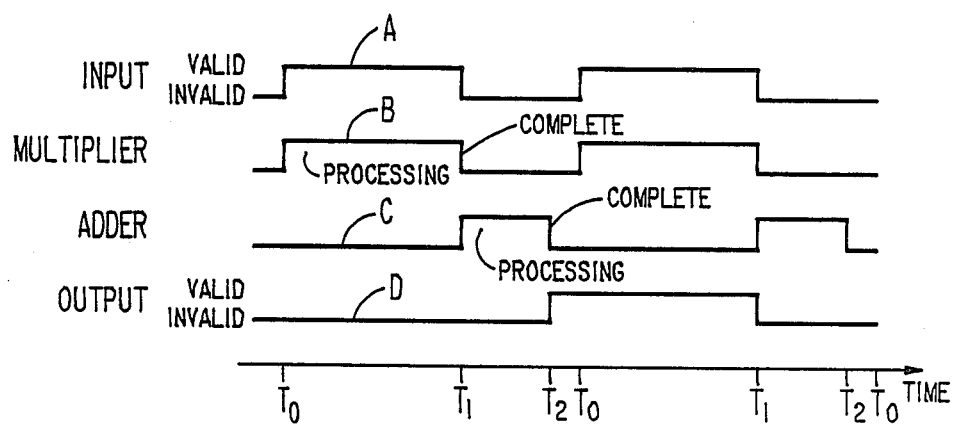
FIG. 6 is a timing diagram illustrating the operation of the system in the configuration of FIG. 5.
Figure 5:
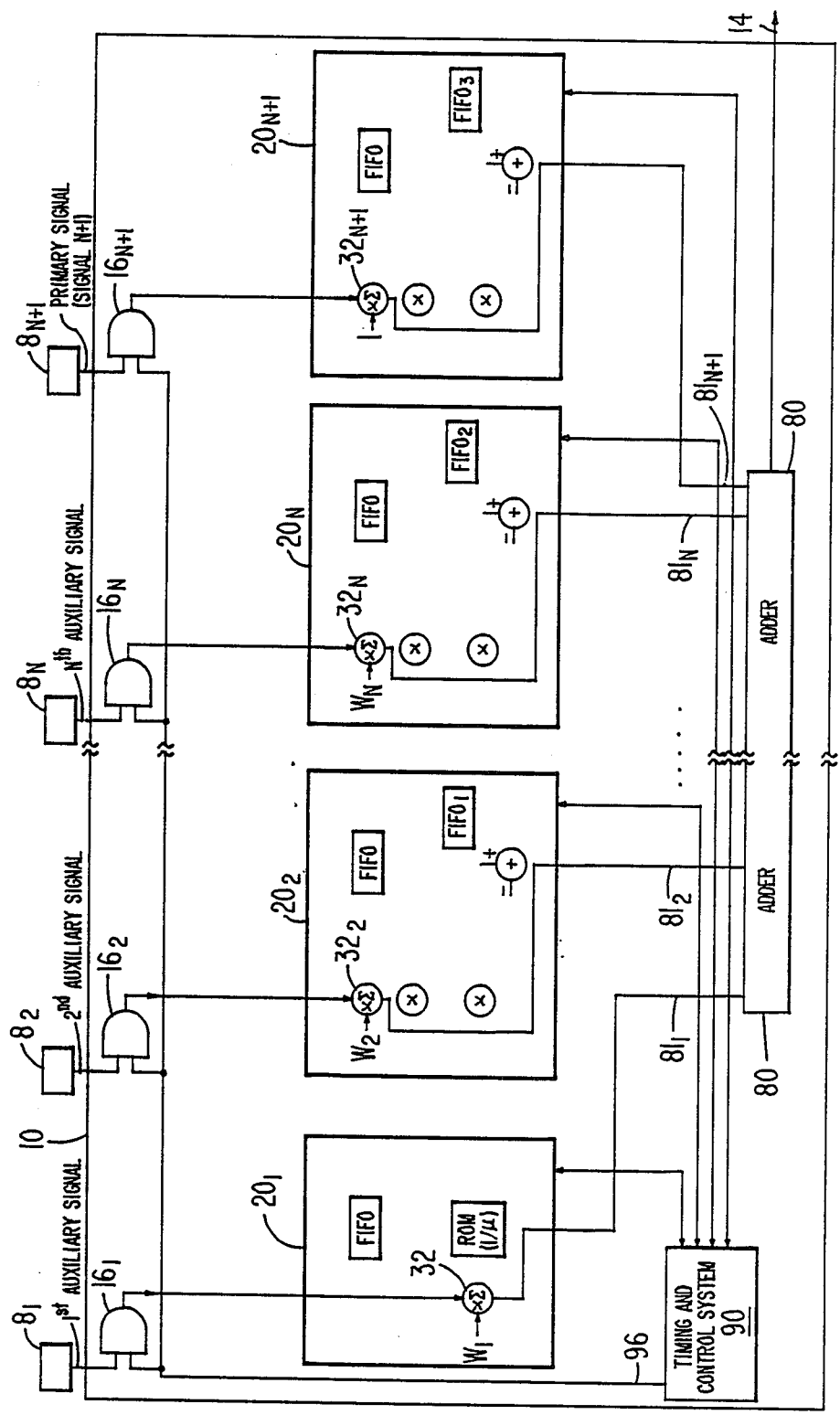
FIG. 5 is an illustration of the processing system of FIG. 1 configured for multiplying received signals by their corresponding weights and adding them to provide a primary signal from which correlated interference is cancelled.

Alternatively, separate hardware may be used for this purpose since only one two-input multiplier is required 5 for each input signal. For economy of hardware, it is preferred to reconfigure the system 10 as shown in FIG. 5. Each set of input values from the N+1 signal sources is received by the processors at time $T_0$ of a weighting cycle as shown in curve A of FIG. 6. From time $T_0$ to time $T_1$, each of these values is multiplied in its corresponding processor's multiplier 32 by the corresponding weight. The resulting product is provided directly to the first output 26 of that processor and is valid from time $T_1$ to $T_2$ (timing curve B of FIG. 6). Each of the outputs $26_1$-$26_{N+1}$ is directly connected to a corresponding input terminal $81_1$-$81_{N+1}$, of the adder 80. In adder 80, these N+1 values are added together during the time period $T_1$-$T_2$ (curve C) to produce a single value which is provided at the output terminal 14 of the processor 10 at a time $T_2$ (curve D). This value at the output terminal 14 of the processor 10 is the received value of the primary signal for that sample from which the correlated interference which was determined during the pre-look cycle has been cancelled. The series of values at terminal 14 comprise a digital version of the primary signal for that reception period. Since processor $20_{N+1}$ merely multiplies the value it receives at its input by one, the processor $20_{N+1}$ can be omitted or bypassed in this reconfiguration, if desired.

Each of the reconfigurations of the system 10 may be accomplished with logic gates which control the interconnection of the various blocks. Depending on the overall system configuration, this reconfiguration can be either controlled directly through hardware or by software.

If desired, it is also feasible to use a first dedicated set of N+1 processors to derive the $L_{ij}$'s, a second dedicated set of N processors (processor $20_1$ being unnecessary) to convert the $L_{ij}$'s to the weights $W_i$ and the second set of N processors to multiply the weights $W_i$ times the received signals during an active period. Alternatively, separate sets of dedicated hardware may be used for three separate functions of determining the correlation coefficients $L_{ij}$, converting the correlation coefficients to weights and multiplying the incoming signals by those weights and adding to obtain the desired signal with the interference cancelled.

What is claimed is:

1. In a signal processing system for cancelling, from a primary digital electronic signal, components of N auxiliary digital signals by multiplying each of said auxiliary signals by a corresponding one of N weights to produce weighted auxiliary signals and combining said weighted auxiliary signals with said primary signal to provide an output signal which is derived from said primary signal by cancelling correlated components of said N auxiliary signals from said primary signal, said primary signal being one having active and inactive periods and a component of interest which is present only during said active periods, where N is an integer greater than two, the improvement wherein said system comprises:

N+1 processing units receiving said N auxiliary signals and said primary signal during one of said inactive periods for producing N(N+1)/2 correlation coefficients $L_{ij}$, wherein a number N of said N+1 processing units are responsive to said N(N+1)/2 correlation coeffients $L_{ij}$ for producing said N weights, and wherein a number N of said N+1 processing units are responsive to said N weights for multiplying each of said N auxiliary signals during one of said active periods of said primary signal by its corresponding one of said N weights; and means coupled to receive said N weighted auxiliary signals and said active primary signal for combining said N weighted auxiliary signals with said active primary signal to cancel said correlated components of said auxiliary signals from said primary signal.

2. In a signal processing system for cancelling from a primary digital electronic signal components of N auxiliary digital signals by multiplying each of said auxiliary signals by a corresponding one of N weights to produce weighted auxiliary signals and combining said weighted auxiliary signals with said primary signal to provide an output signal which is derived from said primary signal by cancelling correlated components of said N auxiliary signals from said primary signal, said primary signal being one having active and inactive periods and a component of interest which is present only during said active periods, where N is an integer greater than or equal to three, the improvement wherein said system comprises:

N+1 processing units each having first and second configuration for, when in said first configuration, receiving N+1 signals during one of said inactive periods for producing N(N+1)/2 correlation coefficients $L_{ij}$, said N+1 signals comprising said primary signal and said N auxiliary signals; and when in said second configuration, being responsive to said N(N+1)/2 coefficients $L_{ij}$ for producing said N weights.

3. The improvement recited in claim 2, wherein said N+1 processing units have a third configuration for multiplying each of said N auxiliary signals by its corresponding one of said N weights during one of said active periods of said primary signal; and means for combining said weighted auxiliary signals with said active primary signal to cancel said correlated components of said auxiliary signals from said primary signal.

4. In a signal processing system for cancelling from a primary digital electronic signal components of first through $N^{th}$ auxiliary digital signals, when N is an integer greater than two, the improvement wherein said system comprises:

N+1 processing units ordered one through N+1;

said first processing unit having a first input terminal and first and second output terminals;

each of said second through $(N+1)^{th}$ processing units having first through fourth input terminals and a first output terminal;

each of said first through $N^{th}$ processing units having said first input terminal thereof coupled to said first output terminal of the next higher order processing unit and to selectively receive, respectively, said first through $N^{th}$ auxiliary digital signals;

said $(N+1)^{th}$ processing unit having said first input terminal thereof coupled to selectively receive said primary digital signal;

said first processing unit including:
means for storing a series of K digital values received at said first input terminal;
first means for multiplying each of said K digital values received at said first input terminal by its complex conjugate and for summing the products of said multiplications, and
means for providing the reciprocal of said sum at said first output terminal and said K stored values in series at said second output terminal;

said second through $(N+1)^{th}$ processing units each having:
said second input terminal thereof coupled to receive the same signal as said first input terminal of said first processing unit;
said third input terminal thereof coupled to said first output terminal of said first processing unit; and
said fourth input terminal thereof coupled to said second output terminal of said first processing unit; and including:
means for storing each of a series of K digital values received at said first input terminal;
first means for multiplying each of said K values received at said first input terminal by the complex conjugate of a corresponding digital value received at said second input terminal and for summing the products of said multiplications to provide an initial sum;
second means for multiplying said initial sum by a digital value received at said third input terminal to provide an intermediate product;
means for storing intermediate products;
third means for multiplying each of a series of K digital values received at said fourth input terminal by said intermediate product;
means for subtracting the result of each of said third multiplications from the corresponding one of said K stored values, and for providing the results of said subtractions as a series of values at said first output terminal; and timing and control means coupled to each of said N+1 processing units for controlling the internal operation of and the coupling of signals among said processing units.

5. The improved signal processing system recited in claim 4 wherein:
each of said means for storing said series of K digital values received at said first input comprises a first-in, first-out memory system.

6. The improved signal processing system recited in claim 4 wherein:
each of said means for storing said intermediate products comprises a first-in, first-out memory system.

7. The improved signal processing system recited in claim 6 wherein said system is reconfigured with:
each of said first through $N^{th}$ processing units coupled to receive a series of digital values from the corresponding auxiliary signal source with said first multiplying means coupled to multiply each received auxiliary signal digital value by its corresponding weight and to provide that product at its first output terminal;
and said system further comprises:
means for adding the corresponding product from each of said first through $N_{th}$ processing units to the corresponding value from said primary signal source and for providing their sum as an output, said means for adding having an output terminal and N+1 input terminals N of which are coupled to receive a corresponding product from first through $N^{th}$ processing units and the $(N+1)^{th}$ of which is coupled to receive said corresponding value from said primary signal source, said means for adding providing said sum at said output terminal of said adding means, said sum being the weighted sum of one corresponding value from each of said auxiliary digital signals and said primary digital signal, whereby each value at said output terminal comprises one value of said primary signal from which said components of said auxiliary digital signals have been cancelled.

8. The improved signal processing system recited in claim 4 wherein:
each of said second through $N^{th}$ processing units has a second output terminal and means for providing intermediate products at said second output terminal;
each of said third through $(N+1)^{th}$ processing units has a fifth input terminal coupled to said second output terminal of the next lower order processor for receiving intermediate products therefrom.

9. The improved signal processing system recited in claim 8 wherein said system is reconfigured with:
each of said second through $(N+1)^{th}$ processing units having one of said input terminals thereof coupled to receive signals from said first output terminals of said lower order processing units; and
said first multiplying means coupled to multiply each of a series of values received at said one input terminal of its processing unit by a corresponding stored intermediate value from its processing unit's means for storing intermediate products and to sum the products of those multiplications; and
to provide said product sum as a weight at its first output terminal.

* * * * *

UNITED STATES PATENT AND TRADEMARK OFFICE
CERTIFICATE OF CORRECTION

PATENT NO. : 4,760,540

DATED : July 26, 1988

INVENTOR(S) : Stanley M. Yuen

It is certified that error appears in the above-identified patent and that said Letters Patent is hereby corrected as shown below:

Column 4, line 60, "$20_{N+1}$ and 20N+1," should be --$20_N$ and $20_{N+1}$,--.

Column 5, line 20, "$20_{N+}$." should be --$20_{N+1}$.--.

Column 5, line 28, "$21_N$ A" should be --$21_N$. A--.

Column 6, line 42, "$20_2$-$20_{n+1}$" should be --$20_2$-$20_{N+1}$--.

Column 6, line 55, before "system" insert --of the--.

Column 6, line 67, "$23_2$-$20_{N+1}$" should be --$23_2$-$23_{N+1}$--.

Column 7, line 3, "$20_3$-$20_{N+1}$" should be --$20_2$-$20_{N+1}$--.

Column 8, line 30, "$T_{10}$-$T_1$" should be --$T_{10}$-$T_{11}$--.

Column 10, line 15, "$W_1$-$W_n$" should be --$W_1$-$W_N$--.

Column 10, line 41, "34" should be --32--.

Column 10, line 61, after "weight" insert --$W_N$--.

Column 10, line 62, "t" should be --the--.

Column 11, line 9, "$W_{N+}1=1$" should be --$W_N$--.

Column 12, line 40, "configuration" should be --configurations--.

UNITED STATES PATENT AND TRADEMARK OFFICE
CERTIFICATE OF CORRECTION

PATENT NO. : 4,760,540

DATED : July 26, 1988

INVENTOR(S) : Stanley M. Yuen

It is certified that error appears in the above-identified patent and that said Letters Patent is hereby corrected as shown below:

Column 12, line 60, "when" should be --where--.

Signed and Sealed this

Tenth Day of January, 1989

Attest:

DONALD J. QUIGG

*Attesting Officer*    *Commissioner of Patents and Trademarks*